United States Patent [19]
Ishiuchi et al.

[11] Patent Number: 4,975,754
[45] Date of Patent: Dec. 4, 1990

[54] TRENCH DUAL-GATE MOSFET

[75] Inventors: Hidemi Ishiuchi, Fujisawa; Toshiharu Watanabe; Kinuyo Tanaka, both of Yokohama, all of Japan

[73] Assignee: Kabushiki Kaisha Toshiba, Kawasaki, Japan

[21] Appl. No.: 373,059

[22] Filed: Jun. 29, 1989

[30] Foreign Application Priority Data

Jul. 6, 1988 [JP] Japan .................................. 63-168018

[51] Int. Cl.⁵ ...................... H01L 29/10; H01L 29/06
[52] U.S. Cl. ................................ 357/23.4; 357/23.3; 357/55
[58] Field of Search ..................... 357/23.3, 23.4, 55

[56] References Cited

U.S. PATENT DOCUMENTS 4,729,966  3/1988  Koshino et al. ..................... 357/23.3

FOREIGN PATENT DOCUMENTS 58-125873  7/1983  Japan ................................. 357/23.4

OTHER PUBLICATIONS

Mizuno et al., "High Speed and Highly Reliable Trench MOSFET With Dual Gate", Symp. VLSI, pp. 23–24, 1988.
V. L. Rideout., "Method for Fabricating an Enclosed DMOS Device", IBM Technical Disclosure Bulletin, vol. 21, No. 5, pp. 2105–2106, 1978.
Richardson et al., "A Trench Transistor Cross-Point DRAM Cell," IEDM Technical Digest, pp. 714–719, 1985.

Primary Examiner—Rolf Hille
Assistant Examiner—Wael Fahmy
Attorney, Agent, or Firm—Finnegan, Henderson, Farabow, Garrett, and Dunner

[57] ABSTRACT

A trench dual-gate MOSFET comprises a projection which is bent to enclose a predetermined region on a semiconductor substrate of a first conductivity type. This projection is defined by a trench formed by selectively removing the surface region of the semiconductor substrate. A gate insulation film is formed on the side wall of the projection and on the semiconductor substrate portion located around the base of the projection. A gate electrode is formed on the side wall of the projection and on the semiconductor substrate portion located around the base of the projection, with the gate insulation film interposed and in a manner to surround the projection. A first impurity region of a second conductivity type, which serves as either a source or drain region, is formed in the top portion of the projection. A second impurity region of the second conductivity, which serves as either a drain or source region, is formed in the surface region of that portion of the semiconductor substrate which is located around the base of the projection.

8 Claims, 4 Drawing Sheets

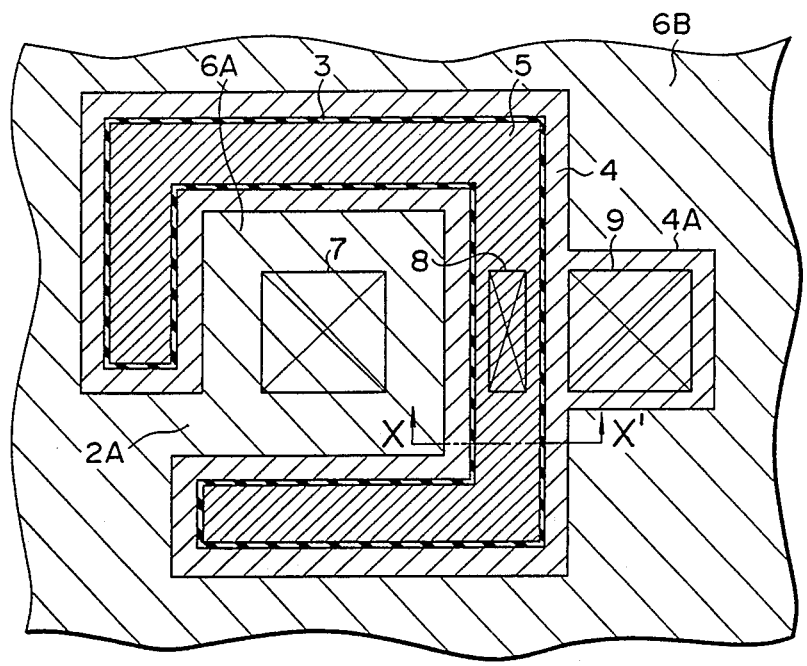
F I G. 1A
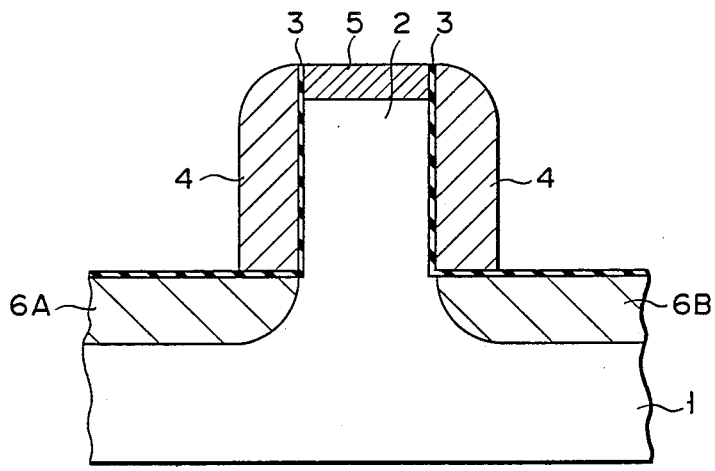
F I G. 1B

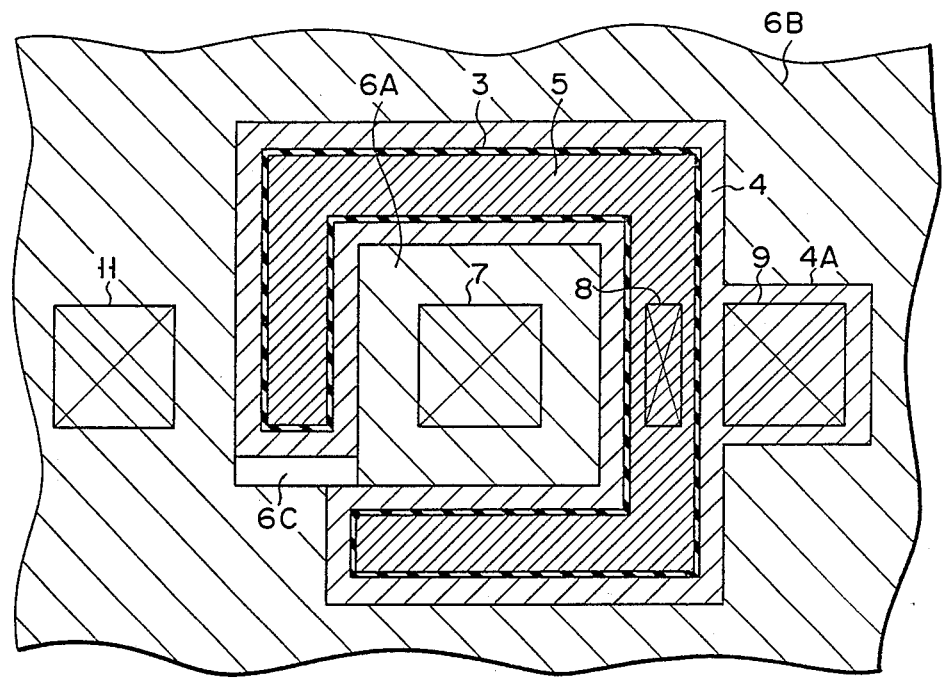
F I G. 3A
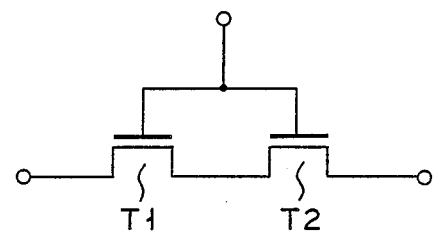
F I G. 3B

TRENCH DUAL-GATE MOSFET

BACKGROUND OF THE INVENTION

1. Field of the Invention

The present invention relates to a MOSFET (i.e., an insulated gate type field effect transistor), and more particularly to a trench dual-gate MOSFET (hereinafter referred to as "TDMOSFET").

2. Description of the Related Art

It is well-known to fabricate a vertical MOSFET by utilizing a projection which is defined by a trench formed in selected portions of a semiconductor substrate. Such a TDMOSFET-fabricating technique is disclosed in, e.g., T. Mizuno et al., "High Speed and Highly Reliable Trench MOSFET with Dual-Gate." *Symp. VLSI Dig.*, pp 23-24, 1988.

However, the TDMOSFET shown in the document has restrictions in actual application. For instance, if the channel width of that TDMOSFET is increased for the improvement of the current driving ability, a wide area will be required for forming the TDMOSFET on a chip. Since the density of integration on the chip is thus adversely affected, the TDMOSFET of the document is not suitable for use as a transistor required of an high current driving ability.

SUMMARY OF THE INVENTION

Accordingly, an object of the present invention is to provide a TDMOSFET which has a small pattern area and yet has a great channel width and which has a high current driving ability per unit area.

To achieve this object, the present invention provides a TDMOSFET which comprises:

a semiconductor substrate of a first conductivity type;

a projection formed on one surface of the semiconductor substrate and having at least one bent portion, the projection being defined by a trench formed by selectively removing the surface region of the semiconductor substrate;

a gate insulation film formed both on the side wall of the projection and on the semiconductor substrate portion which is located around the base portion of the projection;

a gate electrode formed both on the side wall of the projection and on the semiconductor substrate portion located around the base portion of the projection, the gate electrode being formed with the gate insulation film interposed and in a manner to surround the projection;

a first impurity diffusion region of a second conductivity type, which is formed in the top portion of the projection; and a second impurity diffusion region of the second conductivity type, which is formed in a surface region under the semiconductor substrate portion located around the base portion of the projection.

In the TDMOSFET of the above structure, the gate electrode is formed on the entire side wall of the projection, so that the channel width can be increased with no need to increase the pattern area. Accordingly, the MOSFET has a high current driving ability per unit area.

Therefore, the TDMOSFET of the present invention has a small pattern area and yet has a great channel width and which has a high current driving ability per unit area.

BRIEF DESCRIPTION OF THE DRAWINGS

FIG. 1A is a plan view of the pattern of a TDMOSFET according to one embodiment of the present invention.

FIG. 1B is a sectional view taken along line X-X' in FIG. 1A;

FIG. 3A is a plan view of the pattern of a TDMOSFET according to another embodiment of the present invention;

FIG. 3B is an equivalent circuit corresponding to the pattern shown in FIG. 3A.

DETAILED DESCRIPTION OF THE PREFERRED EMBODIMENT

Figure 2C:
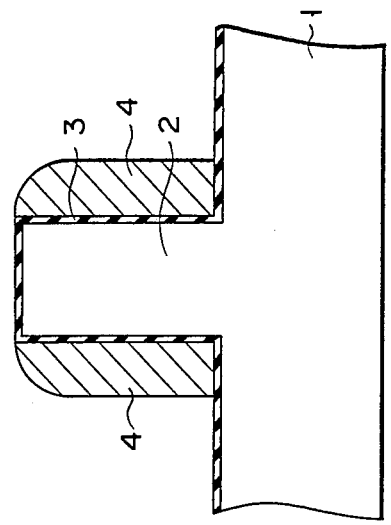
FIGS. 2A through 2D are sectional views illustrating the manufacturing process of the TDMOSFET shown in FIGS. 1A and 1B.

FIGS. 1A and 1B illustrate a TDMOSFET according to the first embodiment of the present invention. FIG. 1A is a plan view of the pattern of the TDMOSFET, while FIG. 1B is a sectional view taken along line X-X' in FIG. 1A. The TDMOSFET is suitable for use as, e.g., a memory cell of a mass storage DRAM. As is shown in FIGS. 1A and 1B, projection 2, which is bent to enclose a predetermined region, is formed on semiconductor substrate 1 of a first conductivity type. Projection 2 is defined by a trench obtained by selectively etching out the surface region of substrate 1. Gate electrode 4, formed of polycrystalline silicon doped with impurities, is formed on the entire side walls of projection 2, with gate oxide film 3 interposed. First impurity diffusion region 5, which is of a second conductivity type and serves as either a source or drain region, is formed in the top region of projection 2. Second impurity diffusion regions 6A and 6B, which are of the second conductivity type and serve as either a drain or source region, are formed in those surface regions located in the vicinity of the base portion of gate electrode 4, in such a manner that second impurity diffusion regions 6A and 6B surround the peripheries of projection 2. Impurity diffusion region 6A is located inside of the region enclosed by projection 2, while impurity diffusion region 6B is located outside of the region enclosed by projection 2. Regions 6A and 6B are connected together at 2A in FIG. 1A, where projection 2 terminates.

Gate electrode-leading portion 4A (i.e., an outlet of gate electrode 4) is formed by extending gate electrode 4 from the side wall of projection 2 along gate oxide film 3 on the upper side of substrate 1. Leading portion 4A is formed simultaneous with gate electrode 4. After the formation of both leading portion 4A and gate electrode 4, an interlayer insulating film (not shown) is formed over the resultant structure. Succeedingly, contact holes 7, 8 and 9 are formed in those portions of the interlayer insulating film which are located on impurity diffusion region 6A, impurity diffusion region 5 and gate electrode-leading portion 4A, respectively. Metal wire (not shown), made of aluminum or another suitable metal, is formed on the interlayer insulating film. The metal wire is connected to impurity diffusion region 6A, impurity diffusion region 5, and gate electrode 4, through contact holes 7, 8 and 9, respectively.

Figure 2D:
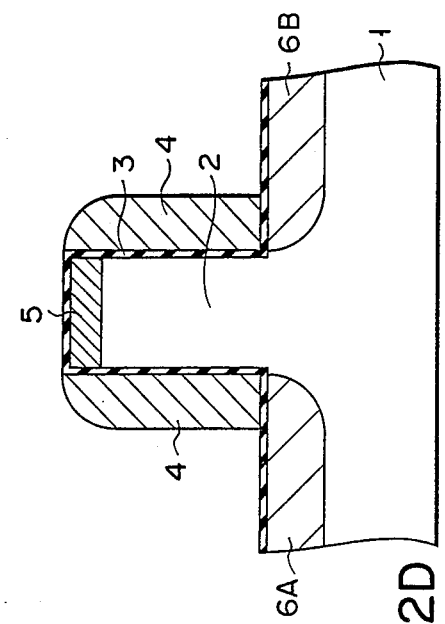
Figure 2A:
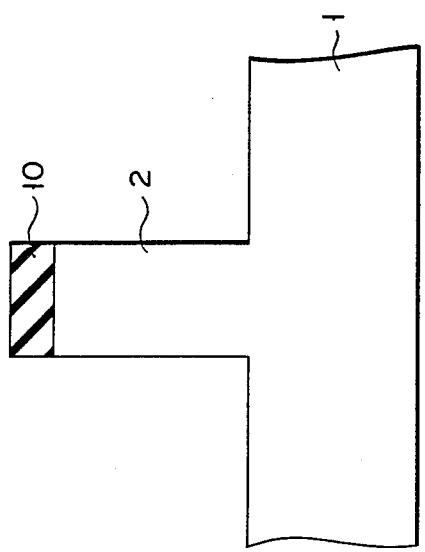
Figure 2B:
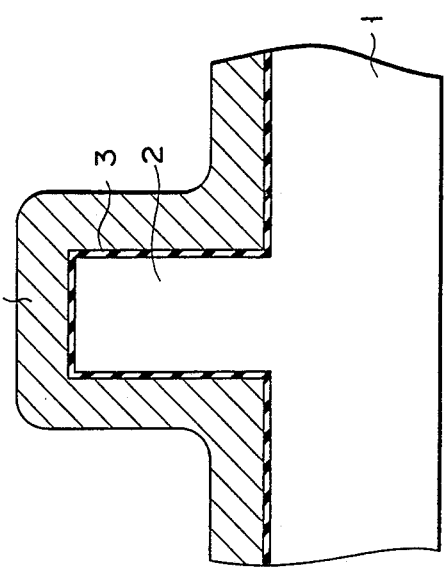

FIGS. 2A to 2D are sectional views for illustrating the manufacturing process of the TDMOSFET shown in FIGS. 1A and 1B. First, mask pattern 10 is formed on one major surface of silicon substrate 1 of a P type (i.e., a first conductivity type). Then, reactive ion etching (RIE) is performed, using pattern 10 as a mask. By the reactive ion etching, the major surface of substrate 1 is anisotropically etched out, leaving a trench in substrate 1. As a result, projection 2 is formed on selected portions on substrate 1, as is shown in FIG. 2A. After mask pattern 10 is removed, substrate 1 having projection 2 is thermally oxidized, such that thermally oxidized film 3 (i.e., a gate oxide film) having a thickness of 200 Å is formed on the surface of substrate 1, as is shown in FIG. 2B. Succeedingly, polycrystalline silicon layer 4 having a thickness of 4,000 Å is formed on the entire surface of substrate 1 by use of the chemical vapor deposition (CVD) process. Phosphorus is diffused within polycrystalline silicon layer 4, for N+ doping.

Next, a mask pattern (not shown) is formed on polycrystalline silicon layer 4. By use of this pattern as a mask, polycrystalline silicon layer 4 is selectively etched out in the RIE process or the like, in such a manner that layer 4 remains on the side wall of projection 2 and on gate electrode-leading portion 4A, as is shown in FIG. 2C. That portion of layer 4 which remains on the side wall of projection 2 serves as a gate electrode.

Thereafter, the mask pattern used in the above RIE process is removed, and another mask pattern (not shown) used for the formation of source and drain regions is formed. By use of this newly-formed pattern as a mask, impurity ions, such as As+ ions, are implanted into the top portion of projection 2 and into the substrate portion located around the base of projection 2, to thereby form regions of the N-type (i.e., the second conductivity type).

Then, the resultant structure is annealed to activate the implanted impurities. As a result of this annealing, first impurity diffusion region 5, serving as either a source or drain region, is formed in the top portion of projection 2, and second diffusion regions 6A and 6B serving as a drain or source region, are formed in the surface region of the substrate portion located around the base of projection 2, as is shown in FIG. 2D.

Although not shown, an interlayer insulation film is formed over the resultant structure. Contact hole 9 is formed in that portion of the interlayer insulation film which is located on gate electrode-leading portion 4A; contact hole 8, in that portion of the film which is located on first impurity diffusion layer 5; and contact hole 7, in that portion of the film which is located on second impurity diffusion layer 6A. Thereafter, a metal such as aluminum is deposited over the interlayer insulation film, and is then patterned to obtain metal wire. The metal wire is connected to leading portion 4A, diffusion region 5, and diffusion region 6A, through contact holes 9, 8 and 7, respectively.

In the TDMOSFET mentioned above, gate electrode 4 is formed on the entire side wall of projection 2, and this projection 2 is bent in a horizontal plane. With this construction, the channel width of the MOSFET can be increased without increasing the pattern area. It is therefore possible to obtain a MOSFET which has a high current driving ability per unit area and can be installed with high density. Further, since gate electrode 4 is formed on the entire side wall of projection 2, gate electrode-leading portion 4A can be formed at any desirable location. It is thus easy to design the pattern in accordance with the need. In the above TDMOSFET, moreover, projection 2 has such a horizontal pattern as encloses a predetermined region, and impurity diffusion region 6A inside the enclosed region and impurity diffusion region 6B outside the enclosed region are connected to each other at the location where projection 2 terminates. Therefore, the metal wire can be electrically connected to both impurity diffusion regions 6A and 6B by providing only one contact portion.

FIG. 3A shows a horizontal pattern of the TDMOSFET according to the second embodiment of the present invention. The structure shown in FIG. 3A differs from that shown in FIG. 1A, in that the region where projection 2 terminates is narrow and in that impurity diffusion region 6A located inside the enclosed region and impurity diffusion region 6B located outside the enclosed region are not connected together. In other words, impurities are not diffused within region 6C shown in FIG. 3A, to electrically disconnect impurity diffusion regions 6A and 6B from each other. Region 6A is connected to metal wire (not shown) through contact hole 7, while region 6B is connected to metal wire (not shown) through contact hole 11.

In the second embodiment having the above pattern construction, two MOSFETs T1 and T2 are formed. As may be understood from the equivalent circuit shown in FIG. 3B, the gate electrode of one MOSFET is connected to that of the other, and one end of the current path of one MOSFET is connected to one end of that of the other. Therefore, MOSFETs T1 and T2 can operate independently of each other.

Figure 4:
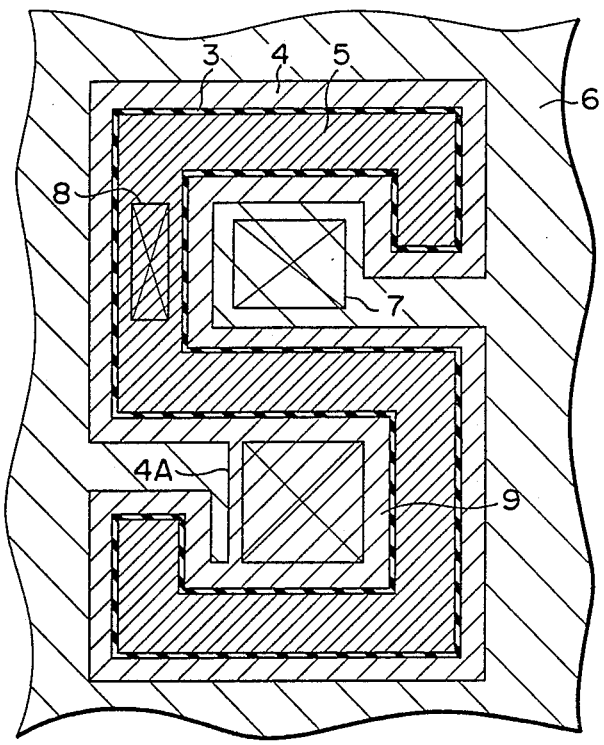
FIGS. 4 and 5 are plan views of the patterns according to still other embodiments of the present invention.
Figure 5:
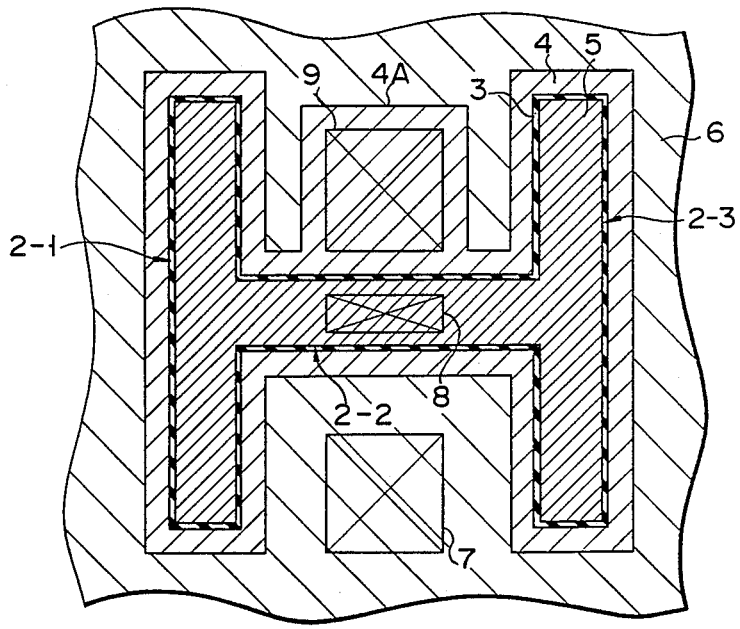

FIGS. 4 and 5 show TDMOSFETs according to other embodiments of the present invention. In the TDMOSFET shown in FIG. 4, projection 2 has a horizontal pattern in the form of "S". The advantages of this pattern structure are substantially similar to those of the pattern structures shown in FIGS. 1A and 3A. That is, the channel width of the MOSFET is great in spite of a small pattern area. In the TDMOSFET shown in FIG. 5, projection 2 has a horizontal pattern in the form of "H". In other words, projection 2 has first section 2-1 (or 2-3) extending at least in a first direction, and second section 2-2 extending from first section 2-1 in a second direction different from the first direction. Even with this pattern structure, the advantages are substantially similar to those of the pattern structures shown in FIGS. 1A, 3A and 4. That is, the channel width of the MOSFET is great in spite of a small pattern area. With the pattern structures shown in FIGS. 4 and 5, therefore, it is possible to obtain a MOSFET which has a high current driving ability per unit area and which ensures installation with high density.

The present invention is not limited to the embodiments described above. Similar advantages to those of the above embodiments may be obtained, if projection 2 has a horizontal pattern having at least one bent portion, or if it has a first section extending at least in a first direction, and a second section extending from the first section in a second direction different from the second first direction.

As mentioned above, the TDMOSFET of the present invention has a great channel width in spite of its small pattern area, and has a high current driving ability per unit area. Therefore, the TDMOSFET of the present invention ensures high-density installation and is suitable for use as a memory cell transistor of a mass storage DRAM.

What is claimed is:
1. A vertical MOSFET, comprising:

a semiconductor substrate of a first conductivity type;

a projection formed from and being on a surface of the semiconductor substrate and having at least one bent portion, said projection being defined by a trench formed by selectively removing a surface region of the semiconductor substrate;

a gate insulation film formed both on a side wall of the projection and on a semiconductor substrate portion located around a base of the projection;

a gate electrode formed both on the side wall of the projection and on the semiconductor substrate portion located around the base of the projection, said gate electrode being formed with the gate insulation film interposed and surrounding the projection;

a first impurity diffusion region of a second conductivity type, which is formed in a top portion of the projection; and a second impurity diffusion region of the second conductivity type, which is formed in a surface region under the semiconductor substrate portion located around the base portion of the projection.

2. A vertical MOSFET according to claim 1, wherein said projection has a horizontal pattern enclosing a predetermined region on the surface of the semiconductor substrate.

3. A vertical MOSFET according to claim 2, wherein an electrical connection to a wire is provided in said predetermined region.

4. A vertical MOSFET according to claim 1, wherein said projection has a horizontal pattern enclosing a predetermined region on the surface of the semiconductor substrate, and a portion of the second impurity diffusion region which is located inside the predetermined region and a portion of the second impurity diffusion region which is located outside the predetermined region are connected together.

5. A vertical MOSFET according to claim 1, wherein said projection has a horizontal pattern enclosing a predetermined region on the surface of the semiconductor substrate, and a portion of the second impurity diffusion region which is located inside the predetermined region and a portion of the second impurity diffusion region which is located outside the predetermined region are disconnected from each other.

6. A vertical MOSFET according to claim 1, wherein said projection has a horizontal pattern in the form of "S".

7. A vertical MOSFET, comprising:

a semiconductor substrate of a first conductivity type;

a projection formed from and being on a surface of the semiconductor substrate, said projection including a first section extending in a first direction, and a second section extending from the first section in a second direction different from the first direction, said projection being defined by a trench formed by selectively removing a surface region of the semiconductor substrate;

a gate insulation film formed both on a side wall of the projection and on a semiconductor substrate portion located around a base of the projection;

a gate electrode formed both on the side wall of the projection and on the semiconductor substrate portion located around the the base of the projection, said gate electrode being formed with the gate insulation film interposed and surrounding the projection;

a first impurity diffusion region of a second conductivity type, which is formed in a top portion of the projection; and a second impurity diffusion of the second conductivity type, which is formed in a surface region under the semiconductor substrate portion located around the base of the projection.

8. A vertical MOSFET according to claim 7, wherein said projection has a horizontal pattern in the form of "H".

* * * * *